United States Patent
North et al.

(10) Patent No.: US 10,329,146 B2
(45) Date of Patent: Jun. 25, 2019

(54) PROCESS FOR FILLING ETCHED HOLES USING PHOTOIMAGEABLE THERMOPLASTIC POLYMER

(71) Applicant: Memjet Technology Ltd., Dublin (IE)

(72) Inventors: Angus North, Sydney (AU); Ronan O'Reilly, Dublin (IE); Gregory McAvoy, Dublin (IE)

(73) Assignee: Memjet Technology Limited (IE)

( * ) Notice: Subject to any disclaimer, the term of this patent is extended or adjusted under 35 U.S.C. 154(b) by 14 days.

(21) Appl. No.: 15/623,267

(22) Filed: Jun. 14, 2017

(65) Prior Publication Data

US 2017/0349431 A1     Dec. 7, 2017

Related U.S. Application Data

(63) Continuation of application No. 15/046,239, filed on Feb. 17, 2016, now Pat. No. 9,708,183.

(60) Provisional application No. 62/117,385, filed on Feb. 17, 2015.

(51) Int. Cl.
*B81C 1/00* (2006.01)
*B41J 2/16* (2006.01)

(52) U.S. Cl.
CPC ......... *B81C 1/00611* (2013.01); *B41J 2/1603* (2013.01); *B41J 2/1628* (2013.01); *B41J 2/1631* (2013.01); *B41J 2/1639* (2013.01); *B41J 2/1645* (2013.01); *B81B 2201/052* (2013.01); *B81B 2203/0353* (2013.01); *B81C 2201/0104* (2013.01); *B81C 2201/0121* (2013.01)

(58) Field of Classification Search
None
See application file for complete search history.

(56) References Cited

U.S. PATENT DOCUMENTS

| | | | | |
|---|---|---|---|---|
| 4,836,885 A * | 6/1989 | Breiten | ............. | H01L 21/31055 204/192.37 |
| 5,435,888 A * | 7/1995 | Kalnitsky | ......... | H01L 21/02126 216/18 |
| 5,516,625 A * | 5/1996 | McNamara | ....... | H01L 21/76224 257/E21.546 |
| 5,702,976 A * | 12/1997 | Schuegraf | ......... | H01L 21/76224 148/DIG. 50 |
| 6,015,757 A * | 1/2000 | Tsai | .................. | H01L 21/31053 257/E21.244 |
| 6,069,069 A * | 5/2000 | Chooi | ............... | H01L 21/31053 438/634 |
| 6,114,219 A * | 9/2000 | Spikes, Jr. | ........ | H01L 21/76224 257/E21.546 |

(Continued)

*Primary Examiner* — Allan W. Olsen
(74) *Attorney, Agent, or Firm* — Cooley LLP

(57) ABSTRACT

A process for filling one or more etched holes defined in a frontside surface of a wafer substrate. The process includes the steps of: (i) depositing a layer of a photoimageable thermoplastic polymer onto the frontside surface and into each hole; (ii) reflowing the polymer; (iii) selectively removing the polymer from regions outside a periphery of each hole, the selective removing comprising exposure and development of the polymer; (iv) optionally repeating steps (i) to (iii) until each hole is overfilled with the polymer; and (v) planarizing the frontside surface to provide one or more holes filled with a plug of the polymer. Each plug has a respective upper surface coplanar with the frontside surface.

20 Claims, 12 Drawing Sheets

(56) References Cited

U.S. PATENT DOCUMENTS

| | | | | |
|---|---|---|---|---|
| 6,194,283 B1* | 2/2001 | Gardner | ............ | H01L 21/76224 |
| | | | | 257/E21.546 |
| 6,531,265 B2* | 3/2003 | Mei | ....................... | G03F 7/0035 |
| | | | | 257/E21.244 |
| 6,645,851 B1* | 11/2003 | Ho | ....................... | G03F 7/0035 |
| | | | | 257/E21.026 |
| 6,756,654 B2* | 6/2004 | Heo | .................. | H01L 21/76229 |
| | | | | 257/510 |
| 6,767,833 B2* | 7/2004 | Shih | .................. | H01L 21/76808 |
| | | | | 216/47 |
| 7,226,873 B2* | 6/2007 | Yen | ....................... | H01L 21/312 |
| | | | | 438/781 |
| 8,058,175 B2* | 11/2011 | Huang | .............. | G02F 1/133553 |
| | | | | 216/19 |
| 8,232,176 B2* | 7/2012 | Lubomirsky | ..... | H01L 21/76229 |
| | | | | 257/E21.279 |
| 9,799,529 B2* | 10/2017 | Yen | .................. | H01L 21/31055 |
| 2003/0151020 A1* | 8/2003 | Lee | .................... | B81C 1/00611 |
| | | | | 252/2 |
| 2007/0004170 A1* | 1/2007 | Kawasaki | ......... | H01L 21/76224 |
| | | | | 438/452 |
| 2009/0104789 A1* | 4/2009 | Mallick | ................ | C23C 16/045 |
| | | | | 438/788 |
| 2011/0094103 A1* | 4/2011 | North | .................... | B41J 2/1628 |
| | | | | 29/890.1 |

* cited by examiner

PROCESS FOR FILLING ETCHED HOLES USING PHOTOIMAGEABLE THERMOPLASTIC POLYMER

CROSS-REFERENCE TO RELATED APPLICATIONS

This application is a continuation of application Ser. No. 15/046,239, entitled PROCESS FOR FILLING ETCHED HOLES, filed on Feb. 17, 2016, which claims priority under 35 U.S.C. § 119(e) to U.S. Provisional Patent Application Ser. No. 62/117,385, entitled PROCESS FOR FILLING ETCHED HOLES, filed on Feb. 17, 2015, the content of which is incorporated by reference herein in its entirety for all purposes.

FIELD OF THE INVENTION

This invention relates to a process for filling etched holes. It has been developed primarily to improve the planarity of filled holes in order to facilitate subsequent MEMS fabrication steps.

BACKGROUND OF THE INVENTION

The Applicant has developed a range of Memjet® inkjet printers as described in, for example, WO2011/143700, WO2011/143699 and WO2009/089567, the contents of which are herein incorporated by reference. Memjet® printers employ a stationary pagewidth printhead in combination with a feed mechanism which feeds print media past the printhead in a single pass. Memjet® printers therefore provide much higher printing speeds than conventional scanning inkjet printers.

In order to minimize the amount of silicon, and therefore the cost of pagewidth printheads, each Memjet® printhead IC is fabricated via an integrated CMOS/MEMS process to provide a high nozzle packing density. A typical Memjet® printhead IC contains 6,400 nozzle devices, which translates to 70,400 nozzle devices in an A4 printhead containing 11 Memjet® printhead ICs.

As described in U.S. Pat. No. 7,246,886, the contents of which are incorporated herein by reference, a typical printhead fabrication process for Memjet® printhead ICs requires etching of holes in a frontside of a CMOS wafer via DRIE (deep reactive ion etching), filling the holes with a sacrificial material (e.g. photoresist) to provide a planar frontside surface, and then subsequently building MEMS nozzle devices on the frontside of the wafer. After completion of the all frontside MEMS fabrication steps, the wafer is thinned from the backside and trenches are etched from the backside to meet with the filled frontside holes. Finally, all sacrificial material is removed from frontside holes and MEMS nozzle chambers by oxidative ashing. In the resulting printhead IC, the frontside holes define individual inlet channels for nozzle chambers.

A critical stage of fabrication is plugging the frontside holes with sacrificial material and planarizing the frontside surface of the wafer. If the frontside surface is not fully planar, then any lack of planarity is carried through subsequent MEMS fabrication steps and, ultimately, may lead to defective devices or weakened MEMS structures with shorter installed lifetimes.

One process for plugging holes formed by DRIE is described in U.S. Pat. No. 7,923,379. In this prior art process, a hole is filled in multiple stages by spinning on sequential layers of a photoresist. After each of these stages, the photoresist on the front surface of the wafer is selectively exposed and developed to leave only photoresist partially filling the hole. The remaining photoresist inside the hole is hardbaked and the process repeated until the hole is fully filled with photoresist. The aim is to provide a hole plugged with photoresist at the end of the process, whereby an upper surface of the photoresist plug is coplanar with a frontside surface of wafer. This is the ideal foundation for subsequent MEMS fabrication steps on the frontside surface of the wafer.

However, the process described in U.S. Pat. No. 7,923,379 has a number of drawbacks. Firstly, it is not possible to achieve true planarity at the end of the process, because the hole is usually slightly overfilled or underfilled after the final exposure and development steps. Secondly, photoresist is highly viscous, which inhibits the escape of solvent or air bubbles. Bubbles can escape from the relatively thin final layer of photoresist, but cannot readily escape from the layer(s) of photoresist at the bottom of the hole. During thermal curing, these trapped solvent bubbles may combine and expand to form relatively large voids, with consequent instability in the plug. Thirdly, photoresists typically contract during thermal curing ('hardbaking'). Contraction of the photoresist during hardbaking also affects the stability of the plug. Thus, even if a planar upper surface can be achieved, the photoresist plug may be susceptible to 'dishing' during subsequent MEMS fabrications steps; and any lack of stability in the photoresist plug may lead to problems in subsequently constructed MEMS structures e.g. nozzle plate cracking.

Thermoplastic polymers, which typically have lower viscosities than most photoresists and can be reflowed when heated, offer a potential solution to at least some of the problems associated with trapped solvent bubbles and contraction of photoresist as described above. However, thermoplastic polymers are not usually photoimageable and require planarizing via a chemical-mechanical planarization (CMP) process. Although a CMP process is technically possible for thermoplastic polymers, it is not practically feasible for thick layers of polymer, which are required to fill relatively deep holes formed by DRIE. This is due to: (1) poor stopping selectivity on the frontside surface when planarizing thick layers of polymer; (2) the rate of CMP being unacceptably slow for large scale fabrication; (3) rapid 'gumming' of CMP polishing pads, which consequently require regular replacement.

It would be desirable to provide an alternative process for filling photoresist holes, which ameliorates at least some of the problems described above.

SUMMARY OF THE INVENTION

In a first aspect, there is provided a process for filling one or more etched holes defined in a frontside surface of a wafer substrate, said process comprising the steps of:

(i) depositing a layer of a thermoplastic first polymer onto the frontside surface and into each hole;
(ii) reflowing the first polymer;
(iii) exposing the wafer substrate to a controlled oxidative plasma so as to reveal the frontside surface;
(iv) optionally repeating steps (i) to (iii);
(v) depositing a layer of a photoimageable second polymer so as to overfill each hole with said second polymer;
(vi) selectively removing the second polymer from regions outside a periphery of the holes to provide overfilled holes, the selective removing comprising exposure and development of the second polymer; and (vii) planarizing the frontside surface to provide one or more holes filled with a plug comprising the first and second polymers, each plug having a respective upper surface coplanar with the frontside surface, wherein the first and second polymers are different.

The process according to the first aspect advantageously provides a robust process for plugging high aspect ratio holes formed by DRIE. In particular, the process provides a plug which is substantially free of bubbles by virtue of using a relatively low viscosity first polymer having thermoplastic reflow properties, which allows bubbles to readily escape during deposition and reflow. Further, the process provides a stable foundation for subsequent MEMS processes by virtue of employing a reflowable thermoplastic first polymer, which uniformly fills the frontside hole. Still further, the process provides a frontside plug having an upper surface coplanar with the frontside surface by virtue of planarizing step (typically chemical-mechanical planarizing). Planarization (e.g. by CMP) is facilitated by use of the photoimageable second polymer for the final filling step, which is removed from regions outside the periphery of each hole by conventional exposure and development. Thus, a minimal amount of the second polymer needs to be removed by planarization, which enables high throughput, good stopping selectivity and minimal gumming of CMP polishing pads (i.e. lower consumable costs). These and other advantages will be apparent to the person skilled in the art from the detailed description of the first embodiment below.

Preferably, the first polymer is less viscous than the second polymer. As foreshadowed above, a relatively low viscosity first polymer facilitates escape of trapped solvent and air bubbles, resulting in a more robust plug.

Preferably, each hole has a depth of at least 5 microns or at least 10 microns. Typically, each hole has depth in the range of 5 to 100 microns or 10 to 50 microns.

Preferably, each hole has an aspect ratio of >1:1. Typically, the aspect ratio is in the range of 1.5-5:1

In one embodiment, steps (i) to (iii) may be repeated one or more times. In other embodiments, steps (i) to (iii) may be performed only once. In an alternative embodiment, steps (i) and (ii) may be repeated one or more times, and step (iii) may be performed only once.

Preferably, an extent of overfill of the hole immediately prior to step (vi) is less than about 12 microns or less than about 10 microns. Minimal overfill is desirable to facilitate subsequent planarization.

Typically, additional MEMS fabrication steps are performed on the planarized frontside surface of the wafer substrate. In a preferred embodiment, the additional MEMS fabrication steps construct inkjet nozzle devices on the planarized frontside surface of the wafer substrate. Each nozzle device may comprise a nozzle chamber in fluid communication with at least one hole, and a respective inlet for each nozzle chamber may be defined by one of said holes.

Preferably, the additional MEMS fabrication steps include at least one of: wafer thinning and backside etching of ink supply channels. Each ink supply channel preferably meets with one or more filled holes to provide fluid connections between the backside and frontside of the wafer. Each ink supply channel is usually relatively wider than the frontside holes.

A final stage of MEMS fabrication preferably employs oxidative removal ("ashing") of the first and second polymers from the holes. Oxidative removal typically employs an oxygen-based plasma, as known in the art.

In a second aspect, there is provided a process for filling one or more etched holes defined in a frontside surface of a wafer substrate, said process comprising the steps of:
(i) depositing a layer of a photoimageable thermoplastic third polymer onto the frontside surface and into each hole;
(ii) reflowing the third polymer;
(iii) selectively removing the third polymer from regions outside a periphery of each hole, the selective removing comprising exposure and development of the third polymer;
(iv) optionally repeating steps (i) to (iii) until each hole is overfilled with the third polymer; and
(v) planarizing the frontside surface to provide one or more holes filled with a plug of the third polymer, each plug having a respective upper surface coplanar with the frontside surface.

The process according to the second aspect makes use of a special class of thermoplastic photoimageable polymers. The desirable property of thermoplasticity enables the third polymer to be reflowed so as to enjoy the same advantages as those described above in connection with the first polymer. Furthermore, the desirable property of photoimageability enables the third polymer to be removed from regions outside a periphery of the holes by conventional photolithographic exposure and development. Accordingly, the process according to the second aspect obviates oxidative removal of the first polymer (as described above in connection with the first aspect), whilst still enjoying the advantages of: a highly robust plug; coplanarity of the plug and frontside surface following planarizing; and efficient planarization by virtue of photolithographic removal of the majority of the third polymer prior to planarization.

Preferably, the process according to the second aspect comprises only a single sequence of steps (i) to (iii), wherein each hole is overfilled with the third polymer after step (iii).

Other preferred embodiments, where relevant, which are described above in connection with the first aspect are of course applicable to the second aspect.

In a third aspect, there is provided a process for filling one or more etched holes defined in a frontside surface of a wafer substrate, the process comprising the steps of:
(i) depositing a layer of a thermoplastic first polymer onto the frontside surface and into each hole;
(ii) reflowing the first polymer;
(iii) optionally repeating steps (i) and (ii) until the holes are overfilled with the first polymer;
(iv) depositing a layer of a photoimageable second polymer;
(vi) selectively removing the second polymer from regions outside a periphery of the holes, the selective removing comprising exposure and development of the second polymer;
(vii) exposing the wafer substrate to a controlled oxidative plasma so as to reveal the frontside surface of the wafer substrate; and
(viii) planarizing the frontside surface to provide one or more holes filled with a plug comprising the first polymer only, each plug having a respective upper surface coplanar with the frontside surface,
wherein the first and second polymers are different.

The process according to the third aspect is analogous in many respects to the process according to the first aspect. However, in the third aspect, the second polymer is used merely to provide a relatively thicker polymeric layer over each hole, each hole being initially overfilled with the first polymer. Therefore, the oxidative removal step ensures that a cap of polymeric material remains over each hole prior to planarization. This is advantageous because any solvent or air bubbles in the second polymer, which may be present at the interface between the first and second polymers, are removed during the planarization step. Hence, the plug of material filling the hole is solely the thermoplastic first polymer, which provides a very robust foundation for subsequent MEMS fabrication steps.

In some embodiments, the process may comprise the additional step of: exposing the wafer substrate to a controlled oxidative plasma so as to reveal the frontside surface of the wafer substrate after step (ii).

Other preferred embodiments, where relevant, which are described above in connection with the first aspect are of course applicable to the third aspect.

In a fourth aspect, there is provided a process for filling one or more etched holes defined in a frontside surface of a wafer substrate, said process comprising the steps of:

(i) depositing a layer of a photoimageable fourth polymer onto the frontside surface and into each hole;

(ii) selectively removing the fourth polymer from regions outside a periphery of each hole, the selective removing comprising exposure and development of the fourth polymer;

(v) optionally repeating steps (i) and (ii) until each hole is overfilled with the fourth polymer; and (vi) planarizing the frontside surface to provide one or more holes filled with a plug of the fourth polymer, each plug having a respective upper surface coplanar with the frontside surface.

The process according to the fourth aspect is most suitable for filling relatively shallower (i.e. less than 10 microns) or low aspect ratio (i.e. less than 1:1) holes. The fourth polymer is typically conventional photoresist, which is not thermoplastic and cannot, therefore, be reflowed. Nevertheless, efficient planarization is still achievable since the amount of fourth polymer to be removed by CMP is minimized.

Other preferred embodiments, where relevant, which are described above in connection with the first aspect are of course applicable to the third aspect.

As used herein, the term "hole" generally means any cavity, via or trench defined in a wafer substrate. By definition, each hole has a floor and sidewalls extending upwards therefrom to meet with a surface of the wafer substrate. Each hole may have any shape in cross-section, such as circular, oblong, rounded oblong, square, rounded square, oval, elliptical etc. Likewise, the hole may be in the form of an elongate trench. In the present context, elongate trenches may be used as 'dicing streets' for dicing silicon wafers into individual chips.

BRIEF DESCRIPTION OF THE DRAWINGS

Embodiments of the present invention will now be described by way of example only with reference to the accompanying drawings, in which.

DETAILED DESCRIPTION OF THE INVENTION

First Embodiment

Figure 1:
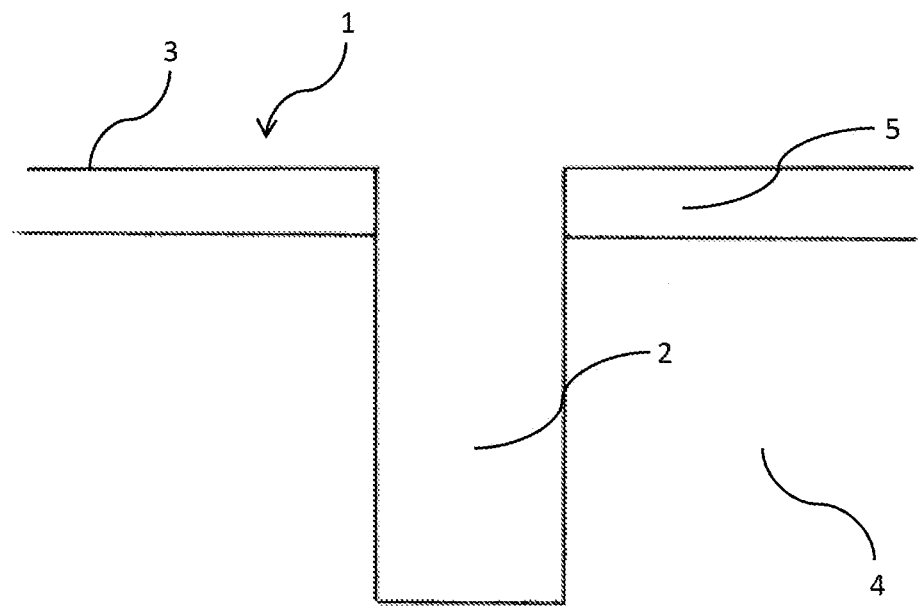
FIG. 1 is a schematic side view of a silicon substrate having a high aspect ratio hole etched in frontside surface.

Referring to FIG. 1, there is shown a substrate 1 having a high aspect ratio hole 2 defined in a frontside surface 3 thereof. The substrate is a CMOS silicon wafer having an upper CMOS layer 5 disposed on a bulk silicon substrate 4. The CMOS layer 4 typically comprises one more metal layers interposed between interlayer dielectric (ILD) layers. The hole 2 may be defined by any suitable anisotropic DRIE process (e.g. 'Bosch etch' as described in U.S. Pat. No. 5,501,893). The hole 2 may have any desired shape in cross-section, the shape being defined by a photoresist mask during the etching process.

Figure 2:
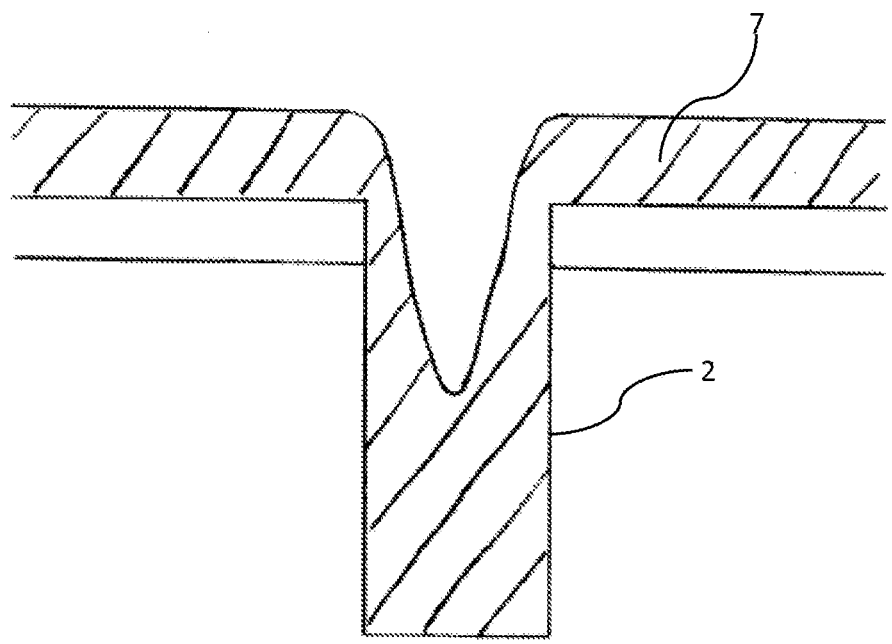
FIG. 2 shows the substrate shown in FIG. 1 after deposition of a thermoplastic first polymer.

FIG. 2 shows the substrate 1 after spin-coating a reflowable thermoplastic polymer 7 onto the frontside surface 3 followed by soft-baking. The thermoplastic polymer 7 is non-photoimageable and may be of any suitable type known to those skilled in the art. For example, the thermoplastic polymer 7 may be an adhesive, such as a polyimide adhesive. A specific example of a suitable thermoplastic polymer 7 is HD-3007 Adhesive, available from HD MicroSystems™.

Soft-baking after deposition of the thermoplastic polymer 7 removes solvent to provide a tack-free film. Since the thermoplastic polymer 7 has a relatively low viscosity (e.g. <1500 Cps), any air or solvent bubbles present in the polymer can readily escape during soft-baking. Still referring to FIG. 2, it can be seen that the thermoplastic polymer 7 is readily deposited inside the high aspect ratio hole 2 during spin-coating due to it relatively low viscosity.

Figure 3:
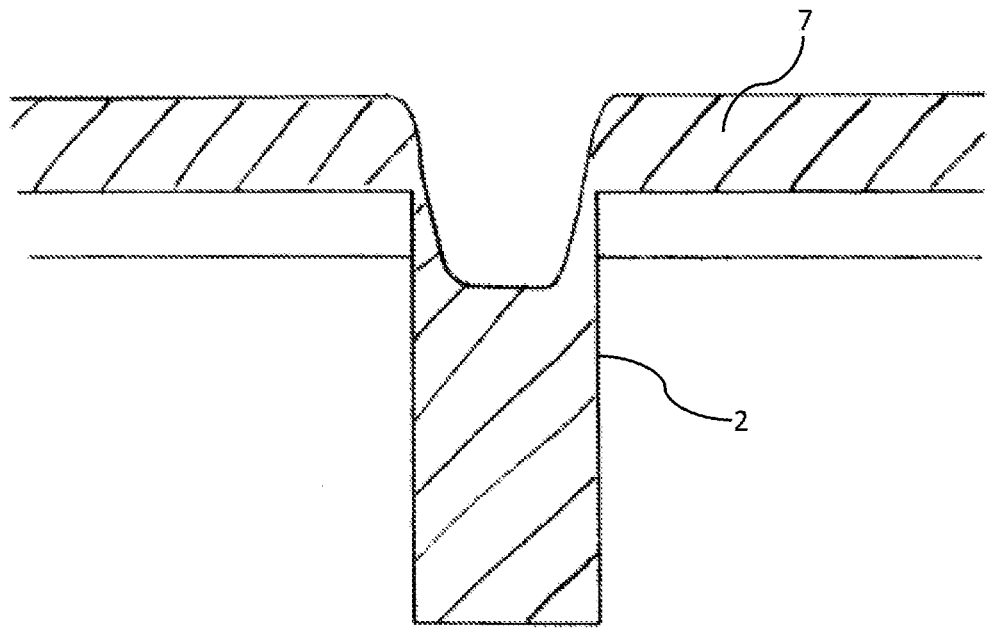
FIG. 3 shows the substrate shown in FIG. 2 after reflowing and curing of the first polymer.

Referring now to FIG. 3, there is shown the substrate 1 after reflow-baking at a relatively higher temperature than soft-baking. This reflow-baking step raises the thermoplastic polymer 7 to a temperature above its glass transition temperature, allowing the polymer to reflow and fill the hole 2 more completely. For example, reflow-baking may be performed at about 300° C., while soft-baking may be performed at about 90° C.

Depending on the depth and aspect ratio of the hole 2, as well as the type of thermoplastic polymer 7 employed, the steps described in connection with FIGS. 2 and 3 may be repeated one or more times until the hole is filled to a level just below the frontside surface, as shown in FIG. 3. The hole 2 may be >60% filled, >70% filled, >80% or >90% after all spin-coating and reflowing steps have been completed.

After the hole 2 has been partially-filled to a desired level, the thermoplastic polymer 7 is then cured at a relatively higher temperature than the reflow baking temperature in order to cross-link and harden the polymer. The resultant plug of thermoplastic polymer 7 shown in FIG. 3 is substantially free of any air or solvent bubbles. Moreover, the reflow step(s) ensure the thermoplastic polymer 7 uniformly contacts sidewalls of the hole 2 to provide a robust foundation for subsequent MEMS processing.

Figure 4:
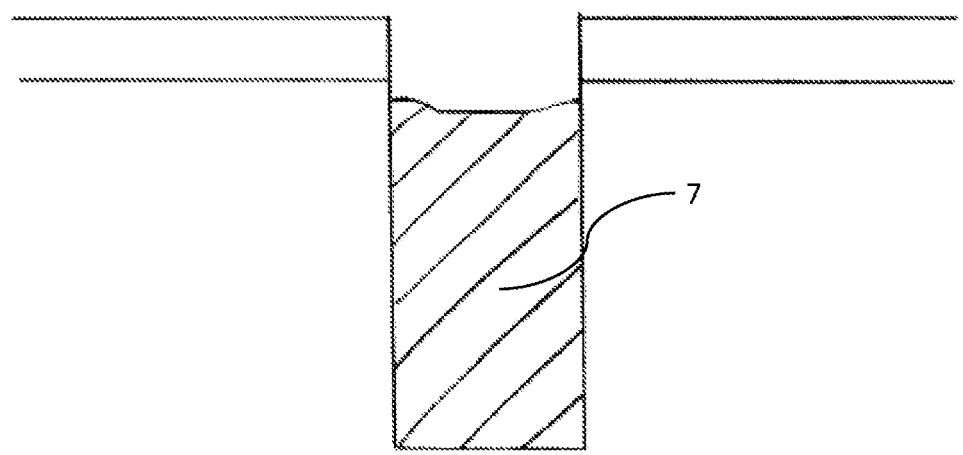
FIG. 4 shows the substrate shown in FIG. 3 after oxidative removal of the first polymer from the frontside surface.

Turning now to FIG. 4, the substrate 1 is shown after removal of a predetermined thickness of the thermoplastic polymer 7 via a controlled oxidative removal process ("ashing"). Typically, the controlled oxidative removal process comprises a timed exposure to an oxygen-based plasma in a conventional ashing oven. A planar thickness of polymer removed by the ashing process is proportional to the period of ashing. As shown in FIG. 4, the ashing process removes a thickness of the thermoplastic polymer 7, such that removal is complete from the frontside surface 3 in regions outside the periphery of the hole 2. However, the hole 2 remains partially-filled with the thermoplastic polymer 7 by virtue of the additional thickness of polymer in the hole.

Figure 5:
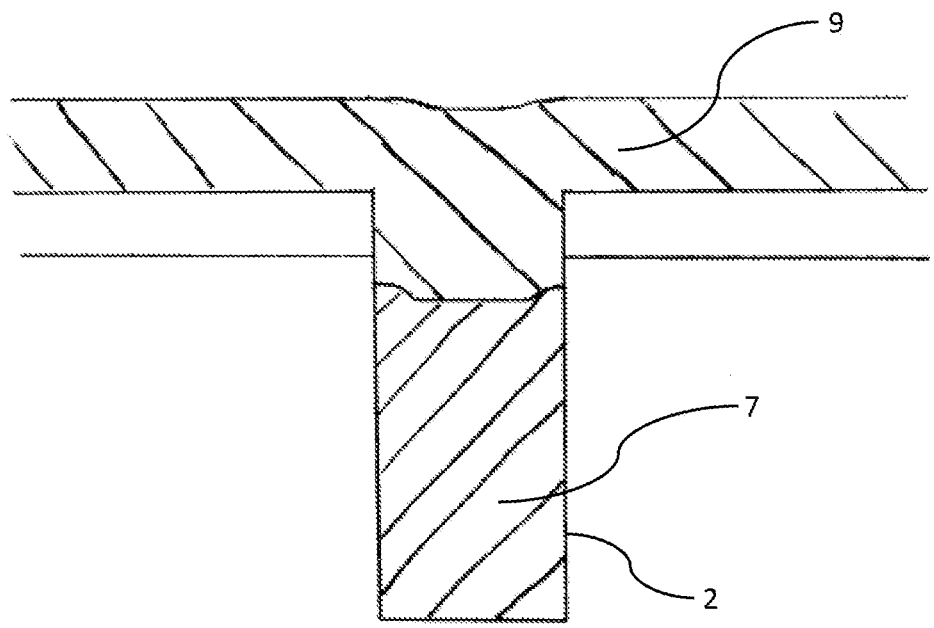
FIG. 5 shows the substrate shown in FIG. 4 after deposition of a photoimageable second polymer.

Next, as shown in FIG. 5, a conventional photoimageable (non-thermoplastic) polymer 9 is deposited onto the frontside surface 3 of the substrate 1 by spin-coating followed by soft-baking. The photoimageable polymer 9 is spin-coated to a thickness of about 8 microns so as to overfill the hole 2. The photoimageable polymer 9 may be of any suitable type known to those skilled in the art. For example, the photoimageable polymer 9 may be a polyimide or a conventional photoresist. A specific example of a suitable photoimageable polymer 9 is HD-8820 Aqueous Positive Polyimide, available from HD MicroSystems™.

Figure 6:
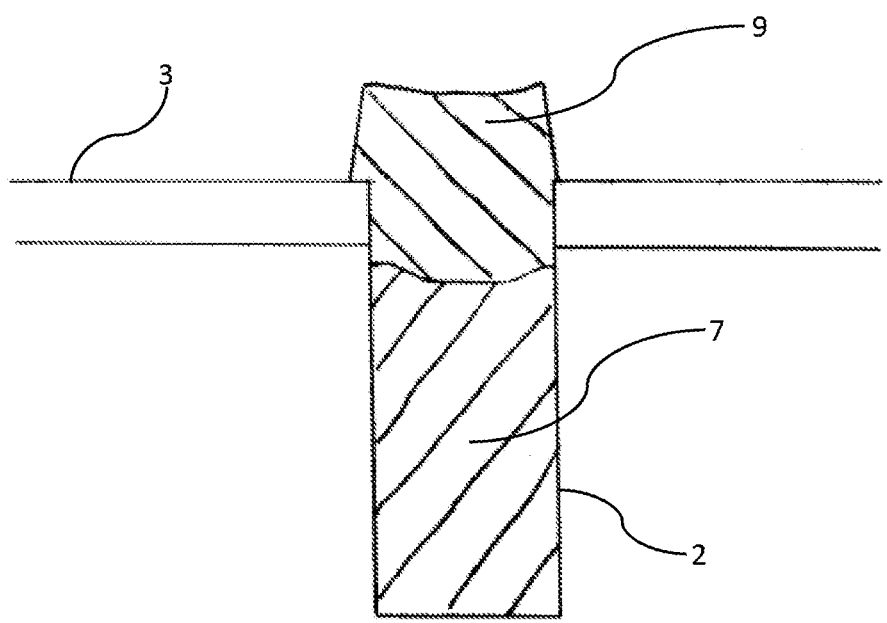
FIG. 6 shows the substrate shown in FIG. 5 after exposure and development of the second polymer.

Referring to the FIG. 6, the photoimageable polymer 9 is then exposed and developed, by conventional methods known to those skilled in the art, so as to remove substantially all of the polymer 9 from regions outside a periphery of the hole 2. The resultant substrate 1 has an overfilled hole 2 having an 8 micron "cap" of the photoimageable polymer 9.

Figure 7:
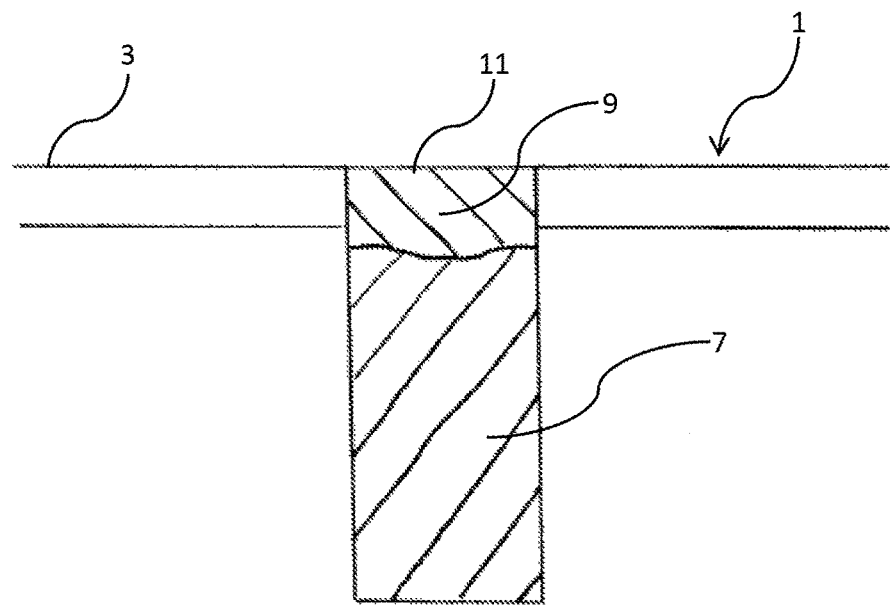
FIG. 7 shows the substrate shown in FIG. 6 after chemical-mechanical planarization.

Following final curing of the photoimageable polymer 9, the frontside surface 3 of the substrate 1 is then subjected to chemical-mechanical planarization (CMP) so as to remove the cap of photoimageable polymer 9 and provide a planar frontside surface, as shown in FIG. 7. Advantageously, the amount of photoimageable polymer 9 that is required to be removed by CMP is relatively small due to the previous exposure and development steps described in connection with FIG. 6. Hence, the CMP process has acceptable process times (e.g. 5 minutes or less), good stopping selectivity and minimal gumming of CMP pads, which reduces the cost of consumables.

In the resultant substrate 1, shown in FIG. 7, the hole 2 is plugged with the thermoplastic polymer 7 and the photoimageable polymer 9. This polymer plug is robust and substantially free of any solvent or air bubbles. Furthermore, an upper surface 11 of the plug is coplanar with the frontside surface 3 by virtue of the final planarizing process. The plugged hole therefore provides an ideal foundation for subsequent frontside MEMS processing steps, such as fabrication of inkjet nozzle structures.

Second Embodiment

Figure 8:
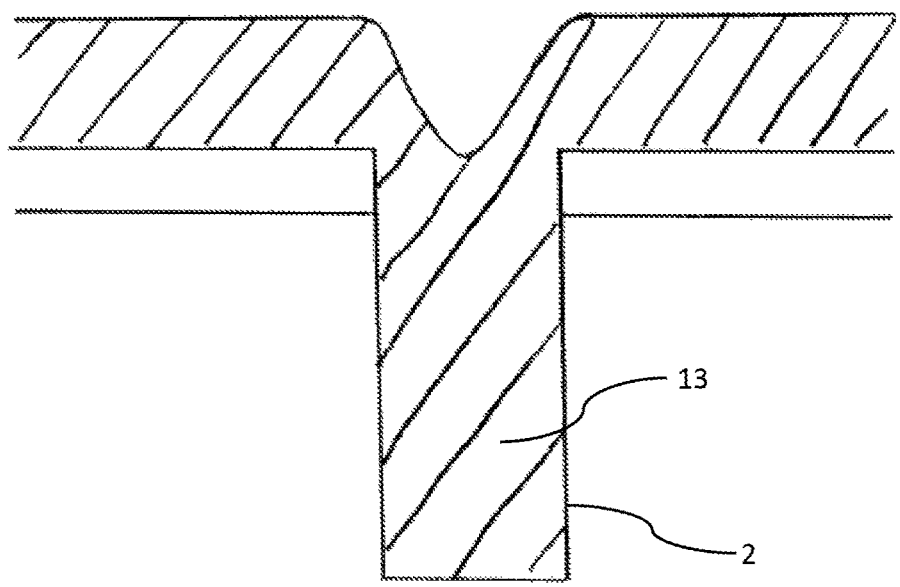
FIG. 8 shows the substrate shown in FIG. 1 after deposition of a thermoplastic photoimageable third polymer.

A second embodiment of the present invention will now be described with reference to FIGS. 8 to 11. Referring firstly to FIG. 8 the hole 2 is filled with a polymer 13 having both thermoplastic and photoimageable properties. An example of the thermoplastic photoimageable polymer 13 is Level® M10 coating, available from Brewer Science. The thermoplastic photoimageable polymer 13 has a relatively low viscosity which is comparable to the thermoplastic polymer 7 described hereinabove. The polymer 13 is therefore able to fill the hole 2 in a single spin-coating followed by soft-baking to removal solvent. The low viscosity and thermoplastic reflow properties of the polymer 13 enable any solvent or air bubbles to escape during soft-baking and reflow baking.

Figure 9:
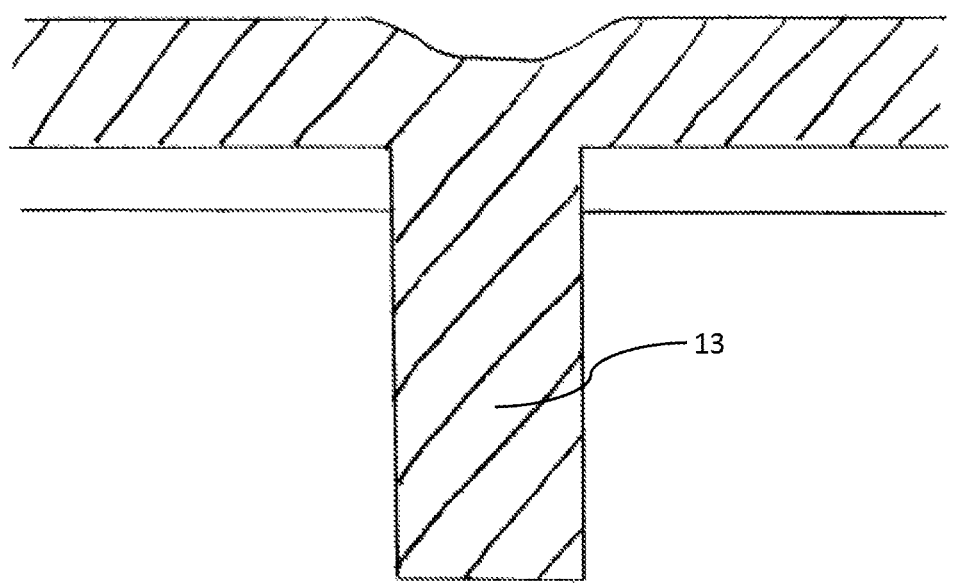
FIG. 9 shows the substrate shown in FIG. 8 after reflowing and curing of the third polymer.

FIG. 9 shows the polymer 13 after reflow-baking at a relatively higher temperature than soft-baking. This reflow-baking step raises the polymer 13 to a temperature above its glass transition temperature, allowing the polymer to reflow and ensure the hole 2 is overfilled.

Figure 10:
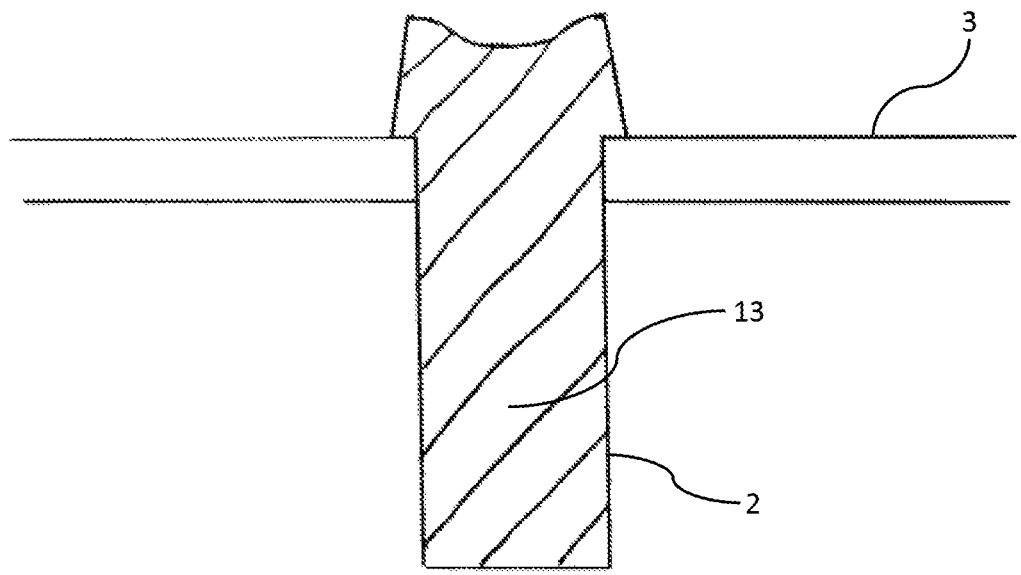
FIG. 10 shows the substrate shown in FIG. 9 after exposure and development of the third polymer.

Referring to the FIG. 10, the thermoplastic photoimageable polymer 13 is then exposed and developed by conventional methods known to those skilled in the art, so as to remove substantially all of the polymer 13 from regions outside a periphery of the hole 2. The resultant substrate 1 has an overfilled hole 2 with a "cap" of the polymer 13.

Figure 11:
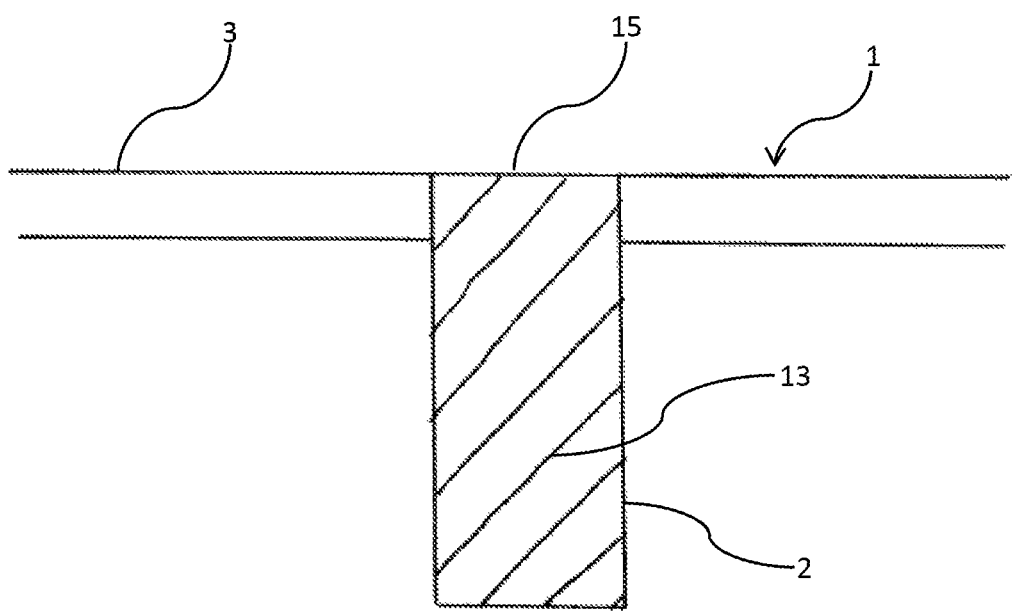
FIG. 11 shows the substrate shown in FIG. 10 after chemical-mechanical planarization.

Following final curing (e.g. UV curing) of the thermoplastic photoimageable polymer 13, the frontside surface 3 of the substrate 1 is then subjected to chemical-mechanical planarization (CMP) so as to remove the cap of polymer 13 and provide a planar frontside surface, as shown in FIG. 11. Advantageously, the amount of polymer 13 that is required to be removed by CMP is relatively small due to the previous exposure and development steps described in connection with FIG. 10. Hence, the CMP process has acceptable process times (e.g. 5 minutes or less), good stopping selectivity and minimal gumming of CMP pads, which reduces the cost of consumables.

In the resultant substrate 1, shown in FIG. 11, the hole 2 is plugged with the thermoplastic photoimageable polymer 13. This polymer plug is robust and substantially free of any solvent or air bubbles. Furthermore, an upper surface 15 of the plug is coplanar with the frontside surface 3 by virtue of the final planarizing process. The plugged hole therefore provides an ideal foundation for subsequent frontside MEMS processing steps, such as fabrication of inkjet nozzle structures.

Third Embodiment

Figure 12:
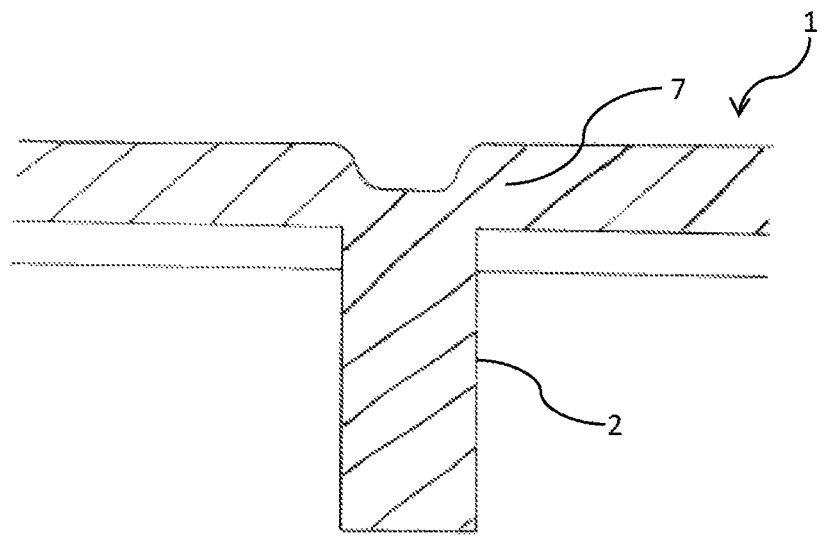
FIG. 12 shows the substrate shown in FIG. 1 after repeated deposition and reflow baking of the thermoplastic first polymer.

Referring to FIGS. 12 to 16, there is shown a third embodiment of the present invention employing the first polymer 7 and the second polymer 9, as described above in connection with the first embodiment. FIG. 12 shows the substrate 1 after spin-coating of the thermoplastic first polymer 7 and reflow baking. By contrast with the first embodiment, the hole 2 is overfilled with the polymer 7, typically using two or more cycles of spin-coating and reflow baking. After reflow baking, the substrate 1 may be exposed to an oxidative plasma to remove the polymer 7 from the frontside surface 3. However, this step is optional and FIG. 12 shows an alternative process where there is no ashing step after each cycle of spin-coating and reflow baking.

Figure 13:
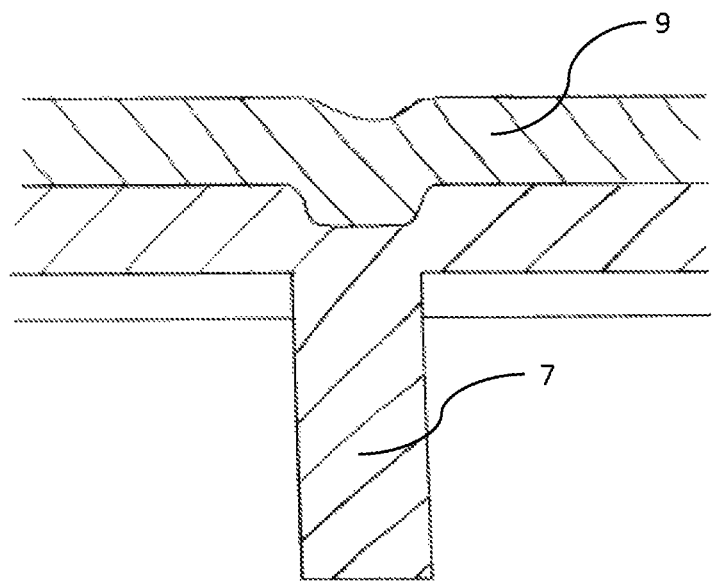
FIG. 13 shows the substrate shown in FIG. 12 after deposition of the photoimageable second polymer.
Figure 14:
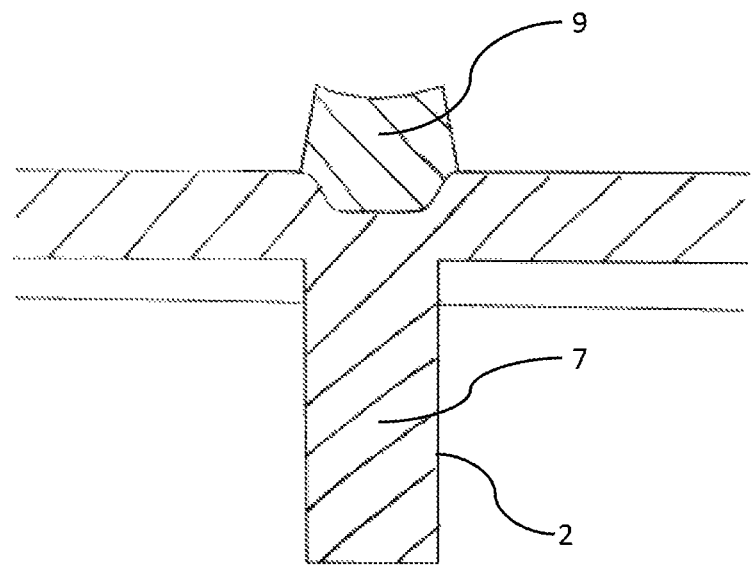
FIG. 14 shows the substrate shown in FIG. 13 after exposure and development of the second polymer.

Referring to FIG. 13, the photoimageable second polymer 9 is then spin-coated on the substrate 1 over the thermoplastic polymer 7. Subsequent masked exposure and development of the second polymer 9 removes the second polymer from regions outside a periphery of the hole 2. Accordingly, as shown in FIG. 14, a relatively thick polymeric layer, comprised of the first polymer and second polymer 9, is disposed over the hole 2; and a relatively thin polymeric layer, comprised of the first polymer 7, is disposed over the remainder of the frontside surface 3 in regions outside a periphery of the hole 2.

Figure 15:
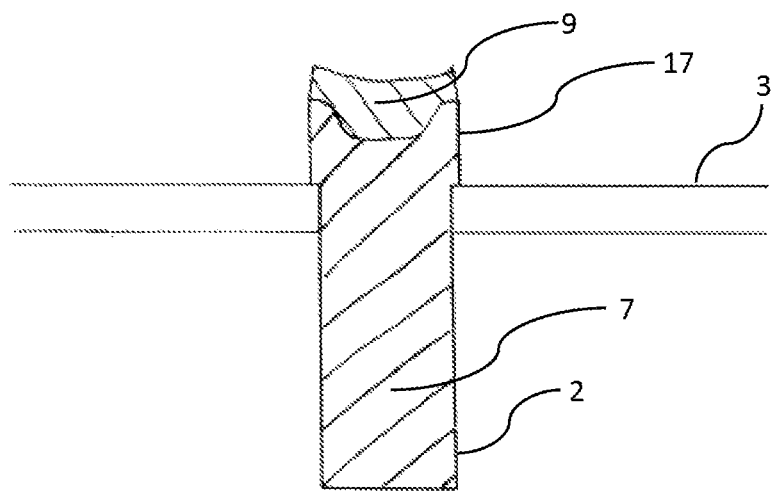
FIG. 15 shows the substrate shown in FIG. 14 after oxidative removal of the first polymer from the frontside surface.

Referring to FIG. 15, the substrate 1 is then exposed to a controlled oxidative plasma ("ashing") so as to remove a predetermined thickness of polymeric material. The first polymer 7 is removed completely from regions outside a periphery of the hole 2 to reveal the frontside surface 3. However, since a relatively thick polymeric layer was disposed over the hole 2 prior to ashing, a polymeric cap 17 remains over the hole after the ashing step, as shown in FIG. 15.

Figure 16:
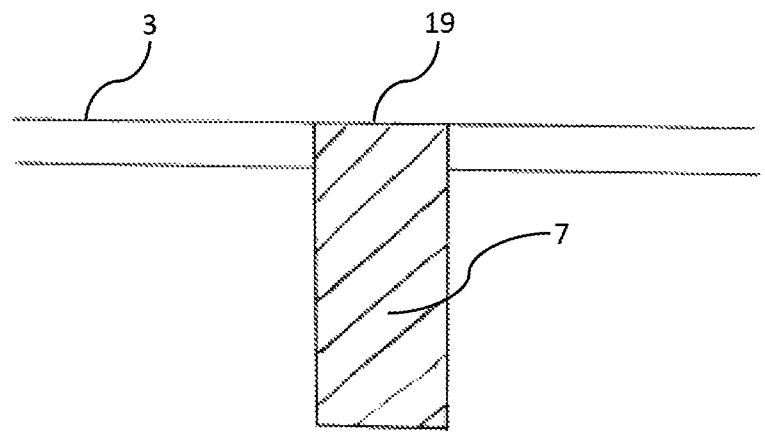
FIG. 16 shows the substrate shown in FIG. 15 after chemical-mechanical planarization.

Finally, as shown in FIG. 16, the frontside surface is subjected to chemical-mechanical planarization (CMP) to remove the polymeric cap 17, stopping on the frontside surface 3. The process according to the third embodiment advantageously provides a plug of the first polymer 7 filling the hole 2. Moreover, an upper surface 19 of the plug of the first polymer 7 is coplanar with the frontside surface 3.

The process according to the third embodiment is potentially advantageous compared to the first embodiment by avoiding any of the second polymer 9 in the final plugged hole. Therefore, any solvent or air bubbles present in the second polymer 9, which may grow at an interface between the first and second polymers, are avoided in the final plugged hole.

Fourth Embodiment

Figure 17:
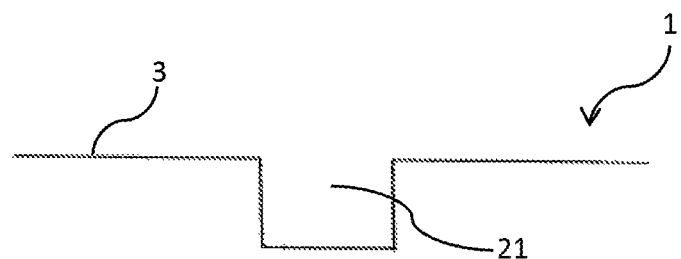
FIG. 17 is a schematic side view of a silicon substrate having a low aspect ratio hole etched in frontside surface.

The fourth embodiment described herein is suitable for filling relatively shallow and/or low aspect ratio holes (e.g. holes having an aspect ratio of <1:1 and/or holes have a depth of less than 10 microns or less than 5 microns). FIG. 17 shows the silicon substrate 1 having a low aspect ratio hole 21 defined in a frontside surface 3 thereof.

Figure 18:
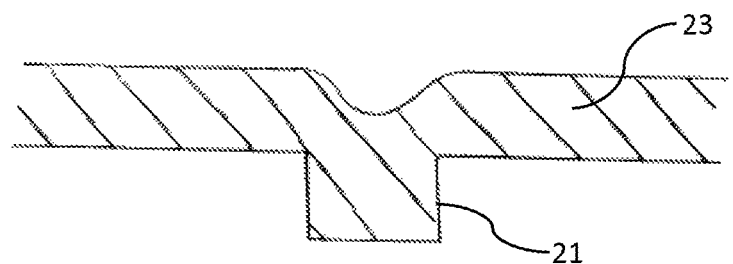
FIG. 18 shows the substrate shown in FIG. 17 after deposition of a conventional photoimageable polymer.

FIG. 18 shows the substrate 1 after spin-coating a conventional photoimageable polymer 23 onto the frontside surface 3 followed by soft-baking. The photoimageable polymer 23 may be of any suitable type known to those skilled in the art, such as polyimide or photoresist.

Figure 19:
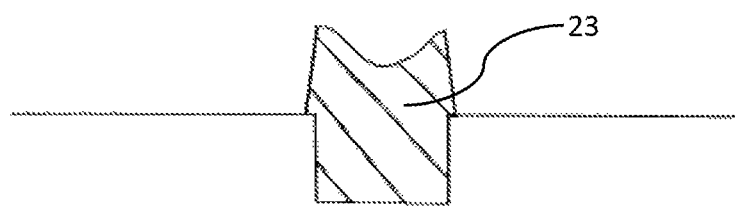
FIG. 19 shows the substrate shown in FIG. 18 after exposure and development.

The hole 17 is intentionally overfilled with the polymer 23 and then the polymer is subsequently removed from regions outside the periphery of the hole by conventional exposure and development steps. FIG. 19 shows the substrate 1 after exposure and development of the polymer 23; the hole 17 is plugged with the polymer and has a cap of polymeric material protruding from the frontside surface 3.

Figure 20:
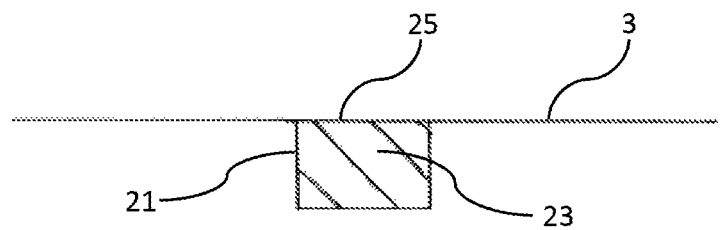
FIG. 20 shows the substrate shown in FIG. 10 after chemical-mechanical planarization.

Following final curing of the photoimageable polymer 23, the frontside surface 3 of the substrate 1 is then subjected to chemical-mechanical planarization (CMP) so as to remove the cap of polymer 23 and provide a planar frontside surface, as shown in FIG. 20. Advantageously, the amount of polymer 23 that is required to be removed by CMP is relatively small due to the previous exposure and development steps described in connection with FIG. 19. Hence, the CMP process has acceptable process times (e.g. 5 minutes or less), good stopping selectivity and minimal gumming of CMP pads, which reduces the cost of consumables.

Moreover, the plug of polymer 23 has a uniform upper surface 25, which is coplanar with the frontside surface 3. The plugged hole therefore provides a good foundation for subsequent frontside MEMS processing steps.

Although the process described above in connection with the fourth embodiment employs a single hole-filling step, it will be appreciated by those skilled in the art that the hole may be filled in multiple stages, similar to the process described in U.S. Pat. No. 7,923,379. However, in contrast with the process described in U.S. Pat. No. 7,923,379, the process according to the third embodiment overfills the hole for subsequent planarization (see FIGS. 18 and 19).

MEMS Inkjet Nozzle Devices

By way of completeness, there will now be described an inkjet nozzle device fabricated by leveraging the hole-filling process described above.

Figure 21:
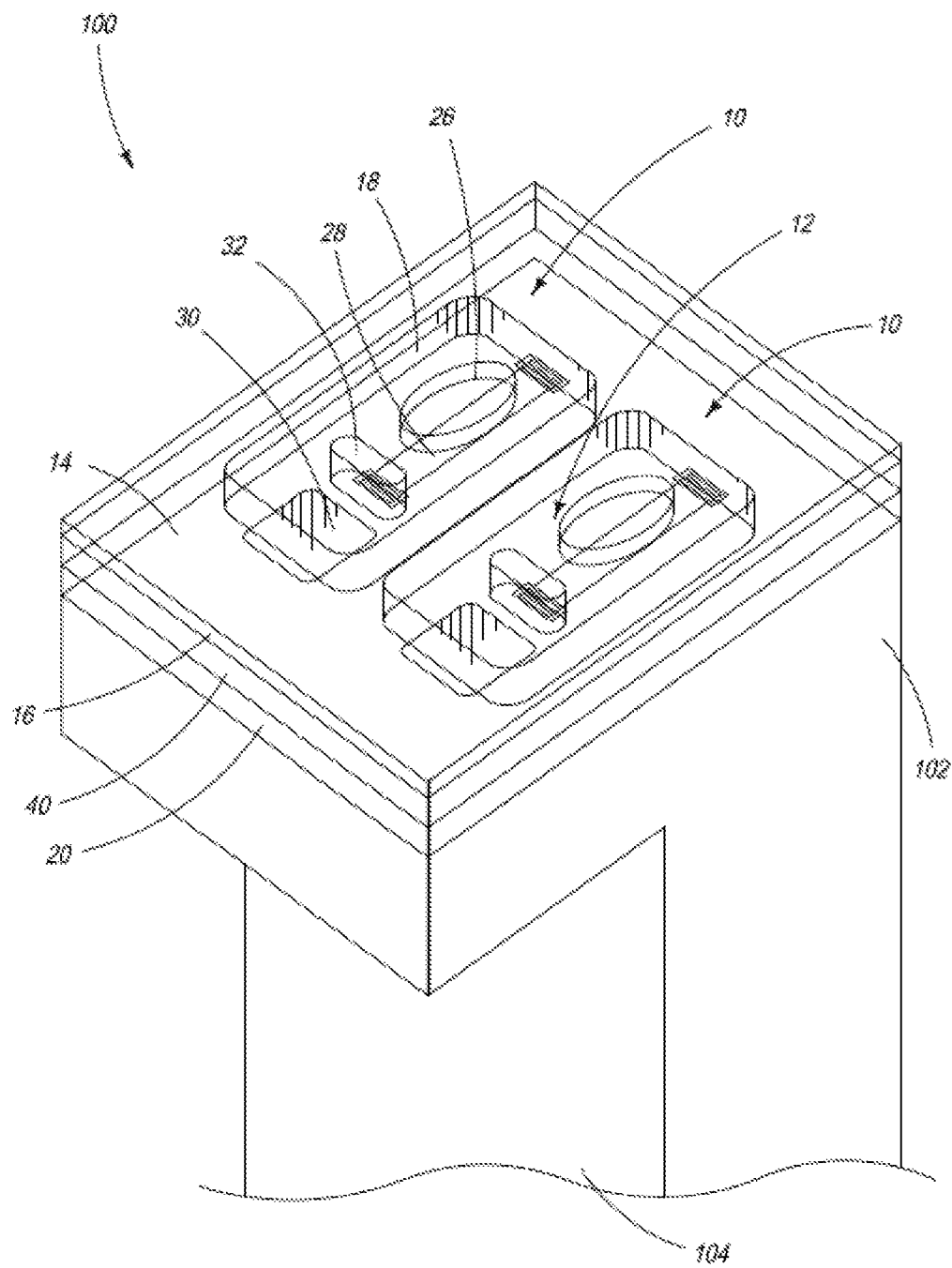
FIG. 21 is a perspective view of inkjet nozzle devices each having a chamber inlet defined in a frontside surface of a silicon substrate.
Figure 22:
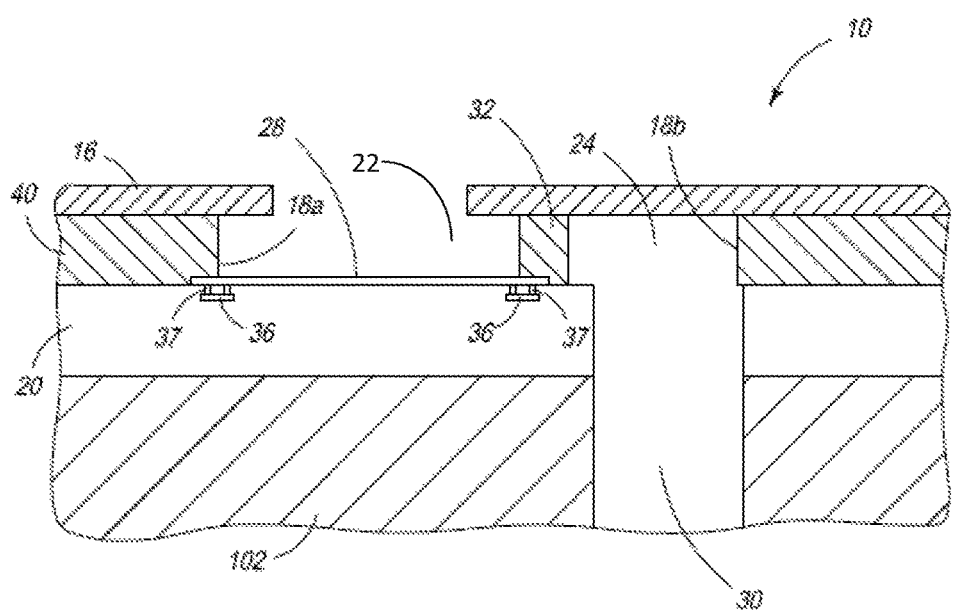
FIG. 22 is a sectional side view of the inkjet nozzle device shown in FIG. 21.

Referring to FIGS. 21 and 22, there is shown an inkjet nozzle device 10 comprising a main chamber 12 having a floor 14, a roof 16 and a perimeter wall 18 extending between the floor and the roof. FIG. 21 shows a CMOS layer 20, which may comprise a plurality of metal layers interspersed with interlayer dielectric (ILD) layers.

In FIG. 21 the roof 16 is shown as a transparent layer so as to reveal details of each nozzle device 10. Typically, the roof 16 is comprised of a material, such as silicon dioxide or silicon nitride.

The main chamber 12 of the nozzle device 10 comprises a firing chamber 22 and an antechamber 24. The firing chamber 22 comprises a nozzle aperture 26 defined in the roof 16 and an actuator in the form of a resistive heater element 28 bonded to the floor 14. The antechamber 24 comprises a main chamber inlet 30 ("floor inlet 30") defined in the floor 14. The main chamber inlet 30 meets and partially overlaps with an endwall 18B of the antechamber 24. This arrangement optimizes the capillarity of the antechamber 24, thereby encouraging priming and optimizing chamber refill rates.

A baffle plate 32 partitions the main chamber 12 to define the firing chamber 22 and the antechamber 24. The baffle plate 32 extends between the floor 14 and the roof 16.

The antechamber 24 fluidically communicates with the firing chamber 22 via a pair of firing chamber entrances 34 which flank the baffle plate 32 on either side thereof. Each firing chamber entrance 34 is defined by a gap extending between a respective side edge of the baffle plate 32 and the perimeter wall 18.

The nozzle aperture 26 is elongate and takes the form of an ellipse having a major axis aligned with a central longitudinal axis of the heater element.

The heater element 28 is connected at each end thereof to respective electrodes 36 exposed through the floor 14 of the main chamber 12 by one or more vias 37. Typically, the electrodes 36 are defined by an upper metal layer of the CMOS layer 20. The heater element 28 may be comprised of, for example, titanium-aluminium alloy, titanium aluminium nitride etc. In one embodiment, the heater 28 may be coated with one or more protective layers, as known in the art.

The vias 37 may be filled with any suitable conductive material (e.g. copper, tungsten etc.) to provide electrical connection between the heater element 28 and the electrodes 36. A suitable process for forming electrode connections from the heater element 28 to the electrodes 36 is described in U.S. Pat. No. 8,453,329, the contents of which are incorporated herein by reference.

Part of each electrode 36 may be positioned directly beneath an end wall 18A and baffle plate 32 respectively. This arrangement advantageously improves the overall symmetry of the device 10, as well as minimizing the risk of the heater element 28 delaminating from the floor 14.

As shown most clearly in FIG. 21, the main chamber 12 is defined in a blanket layer of material 40 deposited onto the floor 14 and etched by a suitable etching process (e.g. plasma etching, wet etching etc.). The baffle plate 32 and the perimeter wall 18 are defined simultaneously by this etching process, which simplifies the overall MEMS fabrication process. Hence, the baffle plate 32 and perimeter wall 18 are comprised of the same material, which may be any suitable etchable ceramic or polymer material suitable for use in printheads. Typically, the material is silicon dioxide or silicon nitride.

A printhead 100 may be comprised of a plurality of inkjet nozzle devices 10. The partial cutaway view of the printhead 100 in FIG. 21 shows only two inkjet nozzle devices 10 for clarity. The printhead 100 is defined by a silicon substrate 102 having the passivated CMOS layer 20 and a MEMS layer containing the inkjet nozzle devices 10. As shown in FIG. 21, each main chamber inlet 30 meets with an ink supply channel 104 defined in a backside of the printhead 100. The ink supply channel 104 is generally much wider than the main chamber inlets 30 and provides a bulk supply of ink for hydrating each main chamber 12 in fluid communication therewith. Each ink supply channel 104 extends parallel with one or more rows of nozzle devices 10 disposed at a frontside of the printhead 100. Typically, each ink supply channel 104 supplies ink to a pair of nozzle rows (only one row shown in FIG. 21 for clarity), in accordance with the arrangement shown in FIG. 21B of U.S. Pat. No. 7,441,865.

The printhead 100 may be fabricated by building the MEMS layer containing inkjet nozzle devices 10 on a wafer substrate having the plugged hole shown in FIG. 7. The planarized frontside surface 3 of the substrate facilitates frontside MEMS fabrication processes. After frontside MEMS fabrication steps are completed, the wafer is thinned from a backside and the ink supply channels 104 are etched from the backside to meet with the plugged frontside holes. Finally, the polymer plug (e.g. polymers 7 and 9) is removed from the frontside hole 2 by oxidative ashing to define the main chamber inlets 30.

It will, of course, be appreciated that the present invention has been described by way of example only and that modifications of detail may be made within the scope of the invention, which is defined in the accompanying claims.

The invention claimed is:
1. A process for filling one or more etched holes defined in a frontside surface of a wafer substrate, said process comprising the steps of:
(i) depositing a layer of a photoimageable thermoplastic polymer onto the frontside surface and into each hole;
(ii) reflowing the polymer;
(iii) selectively removing the polymer from regions outside a periphery of each hole, the selective removing comprising exposure and development of the polymer;
(iv) optionally repeating steps (i) to (iii) until each hole is overfilled with the polymer; and
(v) planarizing the frontside surface to provide one or more holes filled with a plug of the polymer, each plug having a respective upper surface coplanar with the frontside surface.

2. The process of claim 1, wherein each hole has a depth of at least 10 microns.

3. The process of claim 1, wherein each hole has an aspect ratio of >1:1.

4. The process of claim 1, wherein steps (i) to (iii) are not repeated and each hole is overfilled with the polymer after step (iii).

5. The process of claim 1, wherein, in step (v), the wafer is planarized by a chemical-mechanical planarization (CMP) process.

6. The process of claim 1, wherein an extent of overfill of the hole immediately prior to step (v) is less than 12 microns.

7. The process of claim 1 further comprising additional MEMS fabrication steps.

8. The process of claim 7, wherein the additional MEMS fabrication steps construct inkjet nozzle devices on the planarized surface of the wafer substrate.

9. The process of claim 8, wherein each nozzle device comprises a nozzle chamber in fluid communication with at least one hole.

10. The process of claim 9, wherein a respective inlet for each nozzle chamber is defined by one of said holes.

11. The process of claim 10, further comprising at least one of: wafer thinning and backside etching of ink supply channels.

12. The process of claim 11, wherein each ink supply channel meets with one or more filled holes.

13. The process of claim 12, wherein each ink supply channel is relatively wider said one or more holes.

14. The process of claim 13, further comprising oxidative removal of the polymer from the holes.

15. A process for filling one or more etched holes defined in a frontside surface of a wafer substrate, said process comprising the steps of:
(i) depositing a layer of a photoimageable polymer onto the frontside surface and into each hole;
(ii) selectively removing the polymer from regions outside a periphery of each hole, the selective removing comprising exposure and development of the polymer;
(iii) optionally repeating steps (i) and (ii) until each hole is overfilled with the polymer; and
(iv) planarizing the frontside surface to provide one or more holes filled with a plug of the polymer, each plug having a respective upper surface coplanar with the frontside surface.

16. The process of claim 15, wherein, in step (iii), the wafer is planarized by a chemical-mechanical planarization (CMP) process.

17. The process of claim 15, wherein an extent of overfill of the hole immediately prior to step (iii) is less than 12 microns.

18. The process of claim 15 further comprising the step of: constructing inkjet nozzle devices on the planarized surface of the wafer substrate.

19. The process of claim 18, wherein each nozzle device comprises a nozzle chamber in fluid communication with at least one hole.

20. The process of claim 19, wherein a respective inlet for each nozzle chamber is defined by one of said holes.

* * * * *